(12) United States Patent
Yano

(10) Patent No.: US 12,380,949 B2
(45) Date of Patent: Aug. 5, 2025

(54) SEMICONDUCTOR MEMORY DEVICE

(71) Applicant: Winbond Electronics Corp., Taichung (TW)

(72) Inventor: Masaru Yano, Yokohama (JP)

(73) Assignee: WINDBOND ELECTRONICS CORP., Taichung (TW)

( * ) Notice: Subject to any disclaimer, the term of this patent is extended or adjusted under 35 U.S.C. 154(b) by 296 days.

(21) Appl. No.: 17/954,655

(22) Filed: Sep. 28, 2022

(65) Prior Publication Data

US 2023/0118494 A1    Apr. 20, 2023

(30) Foreign Application Priority Data

Oct. 19, 2021 (JP) .................. 2021-170668

(51) Int. Cl.

| | |
|---|---|
| *G11C 13/00* | (2006.01) |
| *G06N 3/065* | (2023.01) |
| *G06N 3/08* | (2023.01) |
| *G11C 16/04* | (2006.01) |
| *G11C 16/10* | (2006.01) |
| *G11C 16/26* | (2006.01) |

(52) U.S. Cl.
CPC ......... *G11C 13/0069* (2013.01); *G06N 3/065* (2023.01); *G06N 3/08* (2013.01); *G11C 13/003* (2013.01); *G11C 13/004* (2013.01); *G11C 16/04* (2013.01); *G11C 16/10* (2013.01); *G11C 16/26* (2013.01)

(58) Field of Classification Search
CPC ............ G11C 16/0483; G11C 2213/77; G11C 11/005; G11C 13/0028; G11C 13/0026; G11C 13/0069; G11C 13/003; G11C 13/004; G11C 16/10; G11C 16/26; G06N 3/08

See application file for complete search history.

(56) References Cited

U.S. PATENT DOCUMENTS

| | | | |
|---|---|---|---|
| 10,157,653 B1 * | 12/2018 | Li ................. | G11C 11/1657 |
| 10,784,313 B1 * | 9/2020 | Gong ............. | G11C 11/54 |
| 2019/0019538 A1 | 1/2019 | Li et al. | |
| 2019/0066780 A1 * | 2/2019 | Hu ................ | G11C 13/0028 |
| 2019/0369873 A1 * | 12/2019 | Liu ............... | G06F 3/0629 |
| 2020/0020393 A1 | 1/2020 | Al-Shamma | |
| 2021/0056382 A1 | 2/2021 | Fantini | |
| 2021/0168321 A1 * | 6/2021 | Yin ............... | G11C 13/003 |

* cited by examiner

*Primary Examiner* — Uyen Smet
(74) *Attorney, Agent, or Firm* — Birch, Stewart, Kolasch & Birch, LLP

(57) ABSTRACT

A semiconductor memory device has a NOR-type memory cell array, a crossbar array, an entry gate, and a column selecting/signal processing unit. The crossbar array has a plurality of rows and columns, variable resistor elements formed in intersections of rows and columns respectively. The entry gate arranged between the memory cell array and the crossbar array, connects a selected bit line of the memory cell array to the crossbar array based on a selection signal. The column selecting/signal processing unit has a column writing unit, a column reading unit, and a NOR writing unit. The column writing unit writes data read from the memory cell array to a selected column of the crossbar array. The column reading unit reads data of the selected column of the crossbar array. The NOR writing unit at least writes data read by the column writing unit to the memory cell array.

13 Claims, 10 Drawing Sheets

| Selection signal | Input | Output |
|---|---|---|
| 00 | Column reading unit | Column writing unit |
| 01 | Column reading unit | NOR writing unit |
| 10 | Row reading unit | Column writing unit |
| 11 | Row reading unit | NOR writing unit |

| Selection signal | Input | Output |
|---|---|---|
| 0 | Row reading unit | Row writing unit |
| 1 | Row reading unit | NOR writing unit |

SEMICONDUCTOR MEMORY DEVICE

CROSS REFERENCE TO RELATED APPLICATIONS

This application claims priority of Japanese Patent Application No. 2021-170668, filed on Oct. 19, 2021, the entirety of which is incorporated by reference herein.

BACKGROUND OF THE INVENTION

Field of the Invention

The present invention relates to semiconductor devices having a crossbar array, and a NOR-type or NAND-type memory cell array, and, in particular, it relates to semiconductor devices capable of serving as Neuromorphic devices.

Description of the Related Art

Crossbar arrays use variable resistor elements to structurally simulate synapses and neurons. They are put to practical use as AI (artificial intelligence) hardware (e.g. Japan patent document 1: JP 6818116). FIG. 1 shows an example of a crossbar array. A crossbar array comprises a plurality of row lines 1, a plurality of column lines 2 and variable resistor elements 3 connecting the intersections of the row lines 1 and the column lines 2. The variable resistor elements 3 are non-volatile memory elements, memorizing different resistances by applying voltages or currents thereto.

The so-called "Synapse", developed between the side that outputs neural information and the side being input neural information, is a contact structure for information delivery (transmission). The axon terminal of a presynaptic cell contacts the dendrite of a postsynaptic cell. When spike trains of the presynaptic cell and the postsynaptic cell occur at a high frequency, the delivery efficiency of the synapse increases. However, a change in bond strength based solely on the spike train difference between the presynaptic cell and the postsynaptic cell is called Spike Timing Dependent Plasticity (STDP). STDP electrical signals can be written in the variable resistor elements when a neural network is applied to the crossbar array. For example, a spike signal Spre is applied to a certain row line, a spike signal Spost is applied to a certain column line, the difference of the spike signals Spre/Spost generated by the presynaptic cell and the postsynaptic cell is written in the crossbar array and the conductance (bond strength) of the variable resistor element is modulated (e.g. Japan patent document 2: JP 6899024 B1).

When a neural network is implemented by a crossbar array, the resistance of the variable resistor element of the crossbar array is modulated based on learning. FIG. 2 is a block diagram showing the structure of a synapse array device having a conventional learning function. The synapse array device 10 comprises a flash memory 20 storing data-for-learning, a crossbar array 30 and a controller 40. The controller 40 reads the data-for-learning from the flash memory 20, and, writes the data-for-learning to the crossbar array 30, to learn the data held in the variable resistor element. In addition, the controller 40 reads learned data from the crossbar array 30 and writes the learned data to the flash memory 20.

Because the data written in the crossbar array 30 is read from the flash memory 20, or because the learned data read from the crossbar array 30 is written in the flash memory 20, there are problems with low data transmission efficiency in conventional synapse array devices 10. As a result, the processing and handling of AI learning takes time.

BRIEF SUMMARY OF THE INVENTION

According to a certain embodiment of the present invention, a semiconductor memory device comprises a memory cell array, having a plurality of non-volatile memory cells arranged in a matrix. The semiconductor memory device comprises a crossbar array having a plurality of rows and a plurality of columns. Variable resistor elements are formed in the intersections of the rows and the columns. The semiconductor memory device comprises a connection device arranged between the memory cell array and the crossbar array. The connection device connects a selected bit line of the memory cell array to the crossbar array according to a selection signal. The semiconductor memory device comprises a column writing device, which writes data read from the memory cell array to a selected column of the crossbar array. The semiconductor memory device comprises a column reading device, which reads data from the selected column of the crossbar array. The semiconductor memory device comprises a writing device, which writes the data read by the column reading device to the memory cell array.

According to the present invention, the ability and efficiency of processing for learning can be improved by a semiconductor memory device having a memory cell array and a crossbar array, thereby providing an appropriate semiconductor memory device for neuromorphic devices.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

According to the present invention, a semiconductor memory device relates to non-volatile memory, which comprises a flash memory of NOR type or NAND type and a crossbar array having variable resistor elements. In some embodiments, the semiconductor memory device includes laminating (stack) between the flash memory chip and the crossbar array chip. In addition, in some other embodiments, the semiconductor memory device integrates the flash memory and the crossbar array on the same chip.

The semiconductor memory device of the invention can function as AI memory having learning function or as neuromorphic device. The flash memory chip stores data-for-learning, and the data-for-learning read from the flash memory are written to the crossbar array. The crossbar array chip, through matrix operation, writes the data-for-learning to the variable resistor elements so as to modulate (i.e., performing learning of resistance) the resistances of the variable resistor elements. In addition, the data learned by the crossbar array are written back to the flash memory chip, and the AI controller uses the learned data written back to the flash memory chip.

Figure 1:
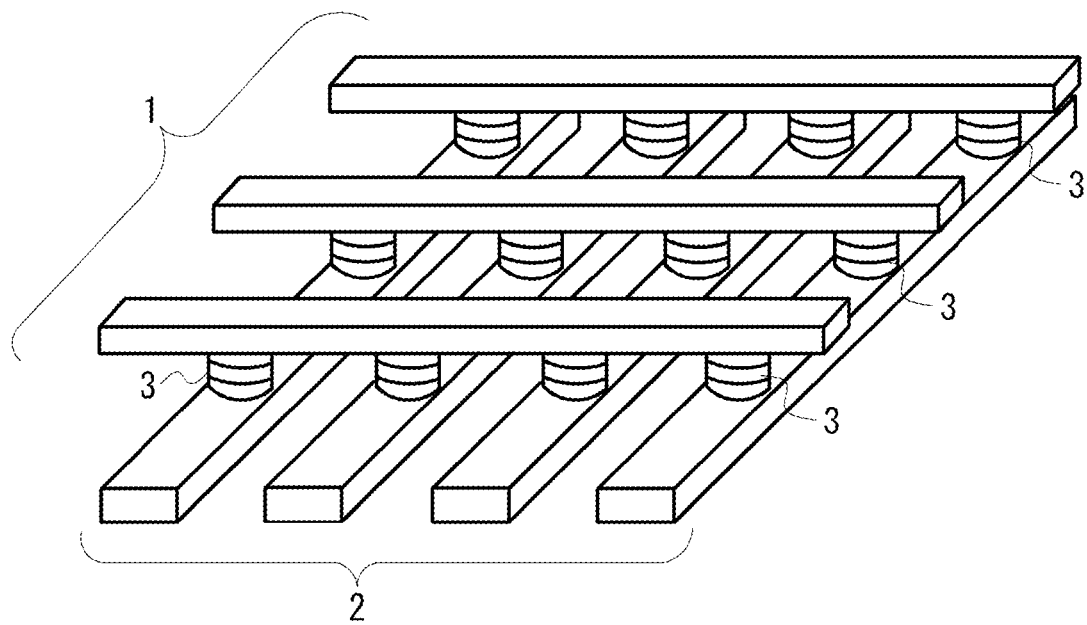
FIG. 1 is an illustrated diagram showing a general crossbar array.
Figure 2:
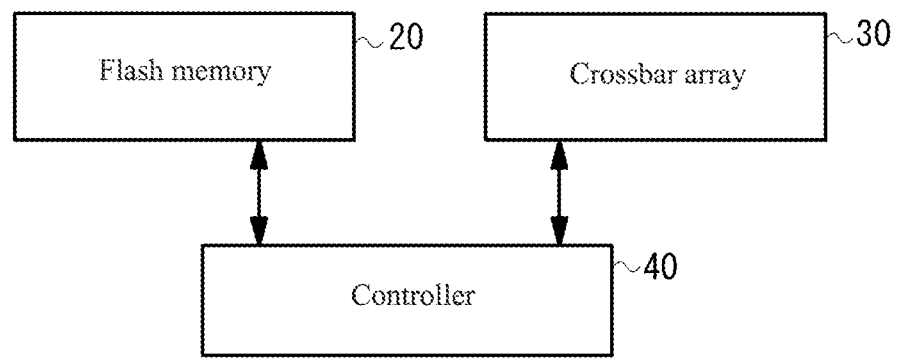
FIG. 2 is a schematic diagram showing a conventional synapse array device.
Figure 3:
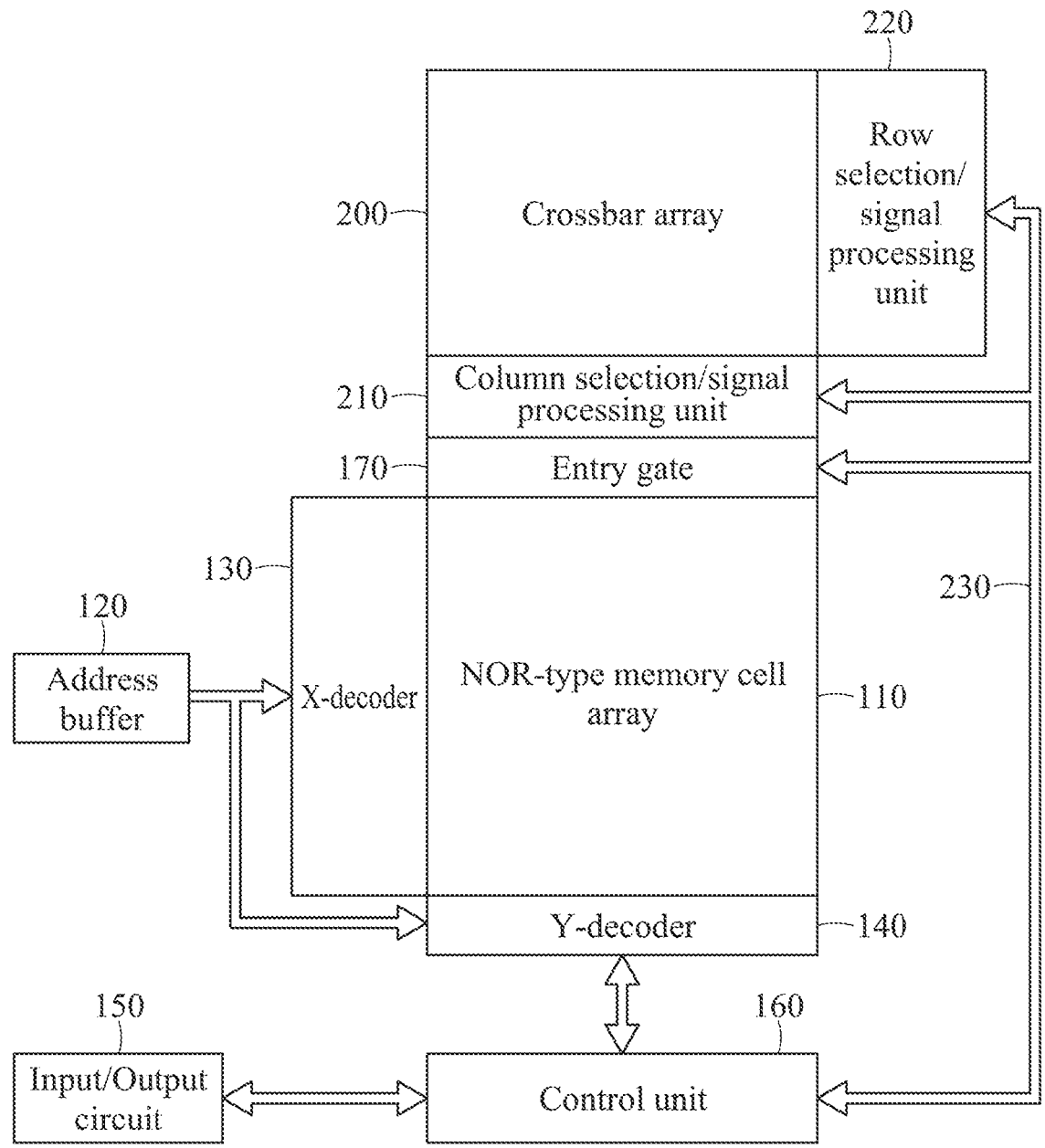
FIG. 3 is a block diagram showing the structure of a semiconductor memory device in accordance with an embodiment of the invention.

Next, an embodiment of the invention will be described in detail with reference of the drawings. FIG. 3 shows the schematic diagram of a semiconductor memory device 100 according to one embodiment of the invention. The semiconductor memory device 100 of the invention comprises a NOR-type memory cell array 110, an address buffer 120 configured to maintain the address received by an input/output circuit 150, a X-decoder 130 configured to select a word line of the memory cell array 110 based on row address, a Y-decoder 140 configured to select a bit line/source line of the memory cell array 110 based on column address, the input/output circuit 150 receiving instruction, data, address from outside or outputting data to the outside, a control unit 160 configured to control entire operations of the semiconductor memory device, an entry gate 170 arranged at an edge of the memory cell array 110, a crossbar array 200 using variable resistor elements, a column selection/signal processing unit 210, a row selection/signal processing unit 220, and a bus 230.

The memory cell array 110, address buffer 120, X-decoder 130, Y-decoder 140, input/output circuit 150, control unit 160 and entry gate 170 constitute the NOR-type flash memory chip. The crossbar array 200, column selection/signal processing unit 210 and row selection/signal processing unit 220 constitute the crossbar array chip. In this embodiment, the crossbar array chip is laminated (stacked) on the flash memory chip. At this moment, the crossbar array 200 is arranged on the memory cell array 110, the row selection/signal processing unit 220 is arranged on the X-decoder 130, the column selection/signal processing unit 210 is arranged on the Y-decoder 140 and the entry gate 170, and the signal transmission between these two chips is performed through the bus 230. The memory capacity of the memory cell array 110 and the crossbar array 200 are not limited in particular, for example, the capacity of the memory cell array 110 is 16 MB and the capacity of the crossbar array 200 is 1 MB.

Figure 4:
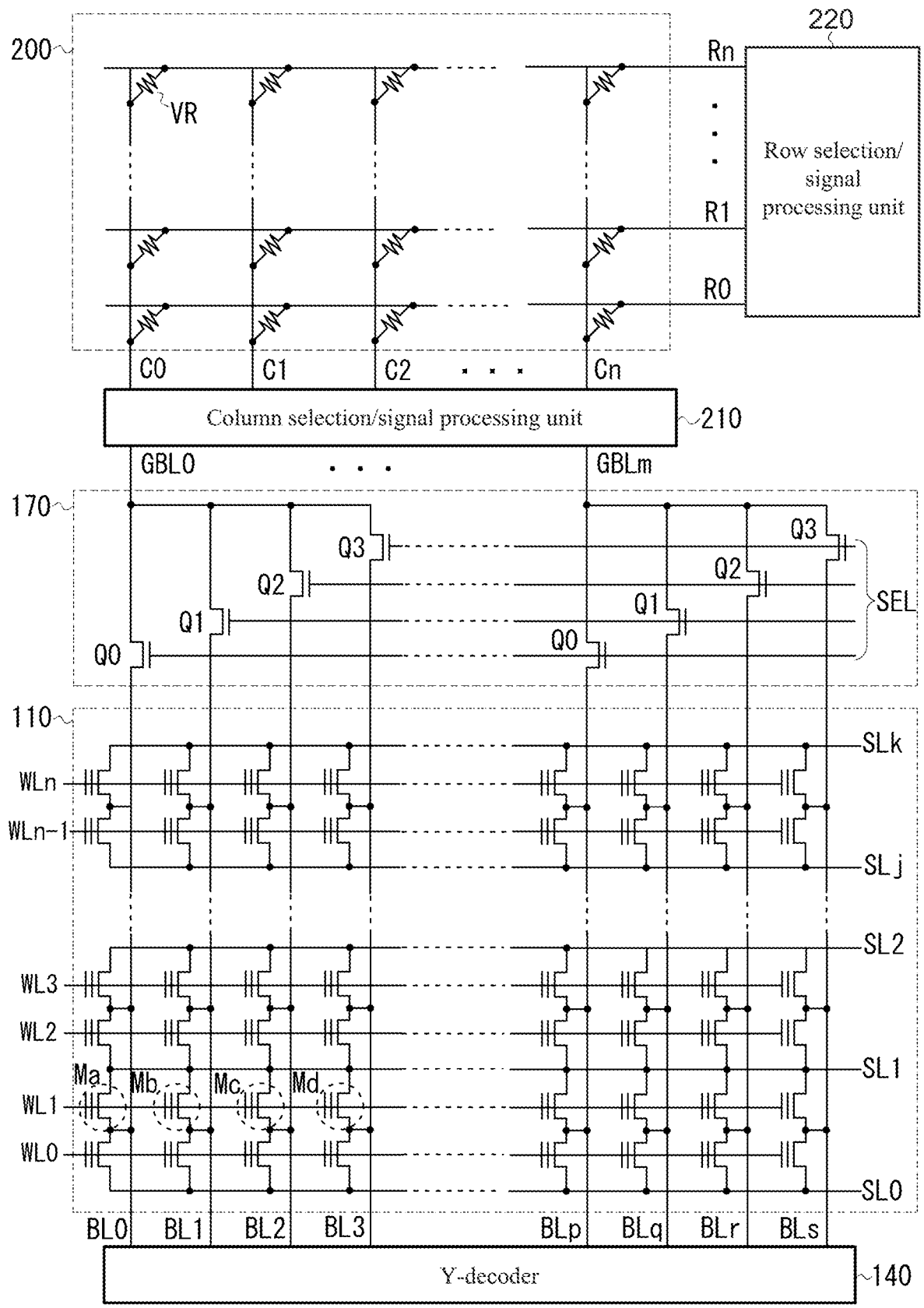
FIG. 4 is a schematic diagram showing the electrical connection between the memory cell array and the crossbar array in the semiconductor memory device in accordance with an embodiment of the invention.

FIG. 4 illustrates the electrical connection between the memory cell array and the crossbar array. The memory cell array 110 comprises a plurality of memory cells arranged in a matrix. The drain regions of the memory cells, which are adjacent and in the column direction, are commonly connected, and these adjacent-connected drain regions are commonly connected to the bit lines BL0, BL1, . . . , BLr, or BLs. In addition, each gate of the memory cells in the row direction is commonly connected to the word lines WL0, WL1, . . . , WLn along the row direction, and each source region of the memory cells in the row direction is commonly connected to the source lines SL0, SL1, . . . , or SLk along the row direction.

The memory cell has a charge-storage layer, such as ONO (oxide-nitride-oxide) layer, for storing electric charge, and a conductive gate of polysilicon or metal thereon, the gate connecting the word line. For example, when reading the memory cell Ma, a positive voltage is applied to the selection word line WL1, and the control unit 160 senses the current through or the voltage between the selection bit line BL0 and the selection source line SL1. When writing (programming) the memory cell Ma, a certain voltage is applied to the selection word line WL1, a voltage corresponding to the writing data is applied to the selection bit line BL0, such that the hot electrons flow from the selection bit line BL0 to the selection source line SL1 and are stored in the charge-storage layer. However, the writing method can be done with another way; the electric charge also can be trapped in the charge-storage layer through FN (Fowler-Nordheim) tunneling. Erasing the memory cell Ma is to apply a certain voltage to the selection word line WL1, for example, injecting electron holes to the charge-storage layer, such that the electric charges stored in the charge-storage layer are depleted through FN tunneling. In addition, the erasure can be performed by a sector unit, not by a memory cell unit.

The bit lines of the memory cell array 110 connect the entry gate 170. The entry gate 170 is arranged at the boundary between the memory cell array 110 and the column selection/signal processing unit 210 of the crossbar array 200. When accessing the crossbar array 200, the entry gate 170 connects the selection bit lines BL of the memory cell array 110 with the column selection/signal processing unit 210, via the global bit lines GBL. Here, assume that four bit lines of the memory cell array 110 as one set in the entry gate 170, and one of the four bit lines can selectively connect a global bit line GBL. For example, the bit lines BL0, BL1, BL2, and BL3 can connect a global bit line GBL via the selection transistors Q1, Q2, Q3, Q4, and the selection transistors Q1, Q2, Q3, and Q4 can be turned on selectively according to the selection signal SEL from the control unit 160 or the selection signal generated based on column address.

The address buffer 120 receives address input from outside, and provides the received row address and column address to the X-decoder 130 and the Y-decoder 140. The X-decode 130, selecting a word line based on the row address, applies voltages depending on the operations, e.g. reading, writing and erasing, etc., to the selected word line. The Y-decode 140, selecting a bit line based on the column address, applies voltages depending on the operations, e.g. reading, writing and erasing, etc., to the selected bit line.

The input/output circuit 150 receives instruction, address, and data etc. from outside, or outputs the data read from the memory cell array 110 to outside. The instruction or data received by the input/output circuit 150 are provided to the control unit 160.

The control unit 160 control reading, writing and erasing of the memory cell array 110 based on the input instructions. In addition, in response to learning instructions for causing the crossbar array 200 to carry out a learning process based on the learning instruction, the control unit 160 writes the read data from the memory cell array 110 to the crossbar array 200 when the learning instruction is input, or controls the writing (programming) operation and writes the learned data of the crossbar array to the memory cell array 110.

The control unit 160 comprises a sense amplifier SA, a writing amplifier WA, and a microcontroller, etc. The sense amplifier SA is configured to sense the data read from the selected memory cell of the memory cell array 110, the writing amplifier WA is configured to write the selected memory cell, and the microcontroller is configured to control a variety of different operations. The microcontroller comprises ROM/RAM storing programs, and a microprocessor executing the programs, and thus controls the operations of the semiconductor memory device 100 by executing the programs.

Next, the crossbar array will be described in detail. The intersections of plural rows R0, R1, . . . , Rn and plural columns C0, C1, . . . , Cn in the crossbar array 200 connect variable resistor elements VR, one of which stores the resistance of the analog level according to the voltage and current applied to the selected row or column. For example, the variable resistor element can be made of transition metal oxide such as oxidation hafnium (HfOx), etc. When the transition metal oxide is applied a writing pulse in a certain direction, its resistance goes to the low resistance state, otherwise when the transition metal oxide is applied a writing pulse in an opposite direction, its resistance goes to the high resistance state. For example, the resistance of the variable resistor element VR at the intersection increases in proposition to the writing pulse when the writing pulse is applied from the column C0 to the row R0. If multiple writing pulses are applied, the resistance increases in proposition to the number of pulses. On the contrary, the resistance of the variable resistor element VR at the intersection decreases in proposition to the writing pulse when the writing pulse is applied from the row R0 to the column C0. In this way, the variable resistor element increases or decreases its resistance in response to the polarity of the writing pulse applied thereto, and thereby changes its resistance according to the energy applied thereto. In addition, in another embodiment, the resistance of the variable resistor element also can change by changing the number of the applied writing pulses and by changing the peak value of the writing pulse applied to the variable resistor element.

The column selection/signal processing unit 210 has a writing function of: selecting the column of the crossbar array 200 and applies the writing pulse to a selected column based on the read data which is read from a selected memory cell of the memory cell array 110, or writing learning data which is read from a selected column to the selected memory cell of the memory cell array 110.

Figures 5A, 5B:
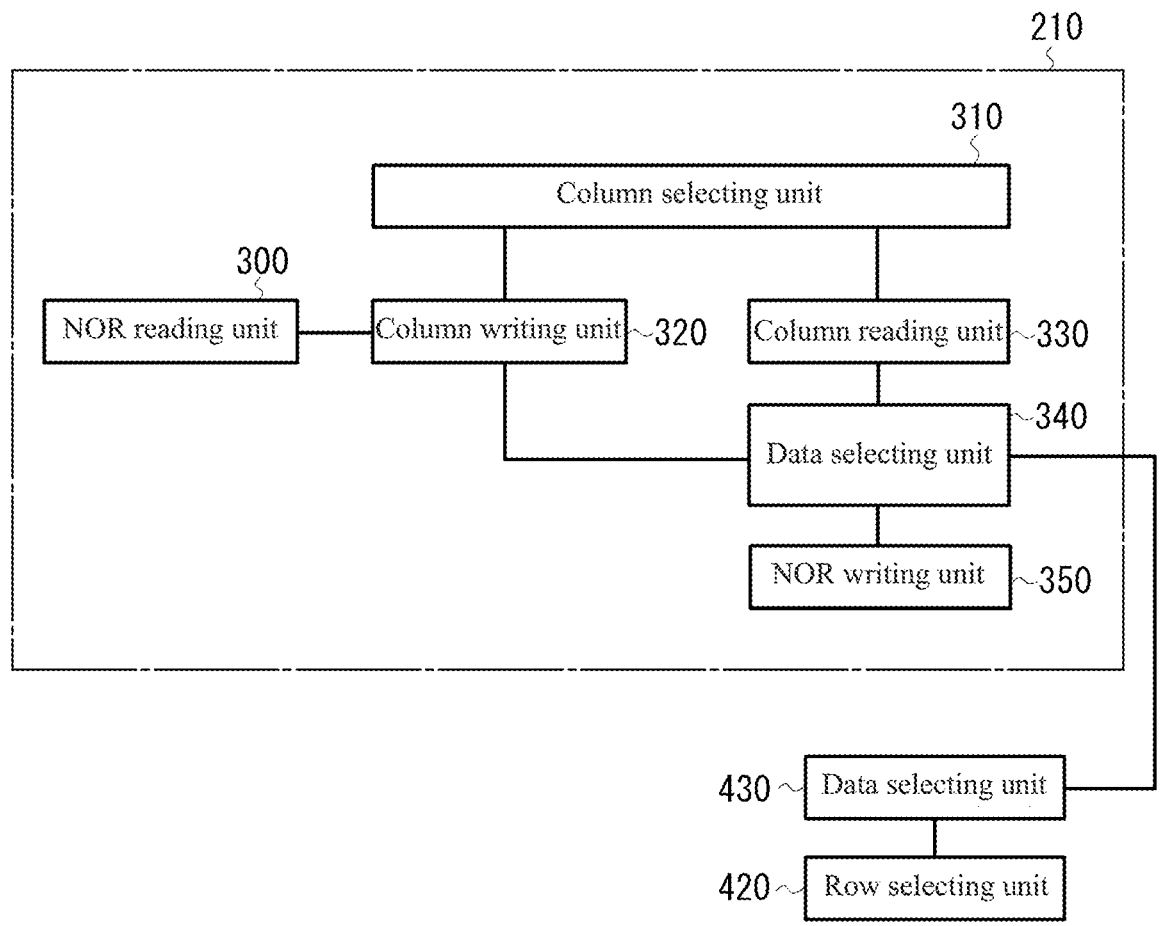
FIG. 5A and FIG. 5B show the structure and configuration of a column selection/signal processing unit in accordance with an embodiment of the invention.

FIG. 5A and FIG. 5B illustrate the internal structure and configuration of the column selection/signal processing unit 210. The column selection/signal processing unit 210 comprises a NOR reading unit 300 configured to read data of the memory cell array selected from the memory cell array via the entry gate 170, a column selecting unit 310 configured to select the column of the crossbar array 200, a column writing unit 320 configured to apply pulse to the selected column, a column reading unit 330 configured to read data output from the selected column, a data selecting unit 340 configured to select the read data from the column reading unit 330 or the read data input from the row reading unit 420 and select the data output to the column writing unit 320 or a NOR writing unit 350, and the NOR writing unit 350 configured to write the read data output from the data selecting unit 340 to the selected memory cell of the memory cell array 110.

When accessing the crossbar array 200, for example writing the data read from the selected memory cell of the memory cell array 110 to the variable resistor element of the crossbar 200, the entry gate 170 is enabled (any of the transistors Q0~Q3 is turned on) such that the selection bit lines BL of the memory cell array 110 connect the NOR reading unit 300 of the column selection/signal processing unit 210 via the global bit lines GBL.

The NOR reading unit 300 comprises a sense amplifier configured to sense the data read from a selected memory cell via the global bit line GBL and maintain the sensed data. For example, when the memory cells Ma, Mb, Mc and Md are selected, the entry gate 170 sequentially turns on the transistors Q0, Q1, Q2 and Q3 and the NOR reading unit 300 reads the data stored in the four selected memory cells Ma, Mb, Mc and Md via the bit lines BL0~BL3.

The column selecting unit 310 receives the column selection signal from the control unit 160 via the bus 230, and selects one column of the crossbar array 200 based on the column selection signal. The selection of column is not limited to one column, and also plural columns can be selected simultaneously.

The column writing unit 320 comprises a writing amplifier configured to apply writing pulses to the column selecting unit 320 based on the data held in the NOR reading unit 300 or the read data output from the data selecting unit 340. When applying writing pulses to the column selected by the column writing unit 320, the row writing unit 410 of the row selection/signal processing unit 220 applies GND (ground reference) to the row selected by the row selection/signal processing unit 220. For example, when the column C0 is selected, the row R0 is selected and the read data is "0", the row writing unit 410 applies GND to the row R0. In this way, the writing pulses are applied to the intersection of the column C0 and the row R0, and the resistance of the variable resistor element increases in proportion to the amplitude of the writing pulse. On the other hand, when the read data is "1", the column writing unit 320 does not apply the writing pulse and the resistance of the variable resistor element is unchanged. In addition, when writing the row selected by the row writing unit 410, the writing sense amplifier of the column writing unit 320 applies GND to the selected column.

In a certain example, when the NOR reading unit 300 sequentially receives the read data of four bits (the 4-bit read data) from the global bit line GBL via the entry gate 170, the column writing unit 320 applies writing pulses to the selected columns, where the number of the writing pulses corresponds the number of data "0" in the 4-bit read data. If all the 4-bit read data are "0", the column writing unit 320 applies 4 writing pulses to the selected columns. If 3 bits of the 4-bit read data are "0", the column writing unit 320 applies 3 writing pulses. If 2 bits of the 4-bit read data are "0", the column writing unit 320 applies 2 writing pulses. If 1 bit of the 4-bit read data is "0", the column writing unit 320 applies 1 writing pulse. If all the 4-bit read data are "1", the column writing unit 320 does not apply writing pulse. In this way, the variable resistor element, at the intersection of the selected column and the selected row, stores the addition result of the 4-bit read data.

In some other embodiments, the column writing unit 320 can change the resistance of the variable resistor element according to the number of the writing pulses, and, for example, also has a DA (digital-to-analog) converter which converts multi-bit data output from the NOR reading unit 300 or the data selecting unit 340 to an analog level, and applies the writing pulse having a peak value corresponding to the converted analog level. For example, if the read data has four bits, the DA converter generates writing pulses with the peak value of 16 levels, and applies the writing pulse to the variable resistor element. At this moment, if all the read data are "0", the writing pulse having highest peak value is generated; or otherwise, if all the read data are "1", the writing pulse having zero peak value is applied, or the writing pulse is not applied.

The column reading unit 330 senses the read data output from the column selected by the column selecting unit 310 and holds the sensed read data. When reading the column selected by the column reading unit 330, the row reading unit 420 of the row selection/signal processing unit 220 applies a reading voltage to the selected row. For example, when the column C0 are selected and the row R0 are selected, the row reading unit 420 applies the reading voltage to the row R0, and the column reading unit 330 senses the reading voltage or reading current through the variable resistor element at the intersection of the row R0 and column C0. In addition, when reading the row selected by the row reading unit 420, the column reading unit 330 applies the reading voltage to the selected column.

The column reading unit 330 comprises an AD (analog-to-digital) converter for converting the reading voltage or the reading current of the analog level to digital data of m bits (m is an integer greater than or equal to 2). For example, the column reading unit 330 converts the reading voltage or reading current to 4-bit read data, and decomposes the resistance of the variable resistor element into 16 levels.

According to the selection signal from the control unit 16, the data selecting unit 340 inputs the read data of the column reading unit 330 or the read data selected by the data selecting unit 430 of the row selection/signal processing unit 220, and provides any of the input read data to the column writing unit 320 or the NOR writing unit 350.

FIG. 5B illustrates a selection example of input/output data of the data selecting unit 340. When a 2-bit selection signal is "00", the data selecting unit 340 outputs the read data input from the column reading unit 330 to the column writing unit 320, and whereby the data read from the selected column can be written to another selected column. When the selection signal is "01", the data selecting unit 340 outputs the read data input from the column reading unit 330 to the NOR writing unit 350, and whereby the data read from the selected column can be written to the selected memory cell of the memory cell array 100. When the selection signal is "10", the data selecting unit 340 outputs the read data input from the row reading unit 420 to the column writing unit 320, and whereby the data read from the selected row can be written to the selected column. When the selection signal is "11", the data selecting unit 340 outputs the read data input from the row reading unit 420 to the NOR writing unit 350, and whereby the data read from the selected row can be written to the selected memory cell of the memory cell array 110.

The NOR writing unit 350, via the entry gate 170, writes the read data output from the data selecting unit 340 to the selected cell of the memory cell array 110. For example, when the 4-bit read data are written to the selected cells Ma, Mb, Mc and Md, the entry gate 170 sequentially turns on the transistors Q0~Q3, and the NOR writing unit 350, via the global bit line GBL0, sequentially applies reading voltages corresponding to the read data to the bit lines BL0, BL1, BL2 and BL3. At this moment, the word line WL1 is applied a voltage for writing, and the source line SL1 is applied the GND. The non-selected word lines, non-selected bit lines and non-selected source lines are in the floating state. In this way, the data of the selected variable resistor elements, i.e. the modulated data through learning/training, will be written back to the selected memory cells Ma, Mb, Mc and Md.

The row selection/signal processing unit 220 selects a row of the crossbar array 200, reads the data from the selected row and writes data to the selected row.

Figures 6A, 6B:
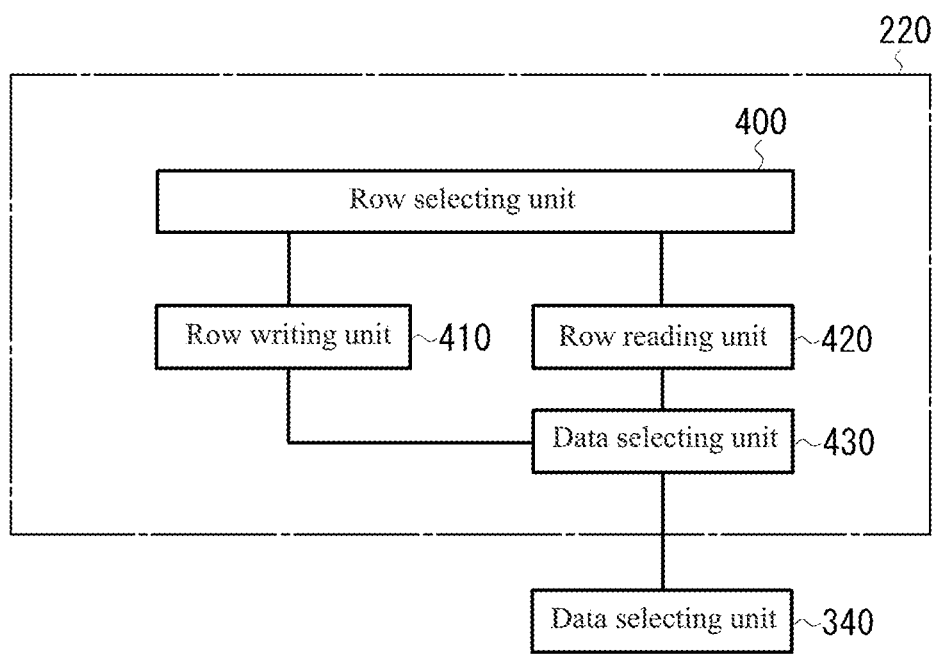
FIG. 6A and FIG. 6B show the structure and configuration of a row selection/signal processing unit in accordance with an embodiment of the invention.

FIG. 6A and FIG. 6B illustrate the internal structure and configuration of the row selection/signal processing unit 220. The row selection/signal processing unit 220 comprises a row selecting unit 400 configured to select a row of the crossbar array 200, a row writing unit 410 configured to apply a writing pulse to the selected row, a row reading unit 420 configured to read data of the selected row, and a data selecting unit 430 configured to output the read data input from the row reading unit 420 to the row writing unit 410 or the data selecting unit 340 of the column selection/signal process unit 210.

The row selecting unit 400, via the bus 230, receives a row selection signal, and selects a row of the crossbar array 200 based on the row selection signal. The row selection is not limited to select one column, and plural rows also can be selected simultaneously.

The row writing unit 410 and the row reading unit 420 have similar configurations to the column writing unit 320 of the column selection/signal processing unit 210, and the column reading unit 330. The row writing unit 410 applies writing pulses to the selected row based on the read data output from the data selecting unit 430. When the writing unit 410 applies writing pulses to the selected row, the column writing unit 320 applies GND to the selected column. For example, when the row R1 is selected, the column C1 is selected, and the data is "0", the row writing unit 410 applies writing pulses to the row R1 and the column writing unit 320 applies GND to the column C1. In this way, the writing pulses are applied to the intersection of the row R1 and the column C1, and the resistance of the variable resistor element decreases in proportion to the amount of the writing pulses. On the other hand, when the input data is "1", the row writing unit 410 does not apply the writing pulse and the resistance of the variable resistor element VR is unchanged.

The row reading unit 420, via the row selecting unit 400, senses the read data output from the selected row. When performing reading via the row reading unit 420, the column reading unit 300 applies a reading voltage to the selected column. For example, when the row R1 is selected and the column C1 is selected, the column reading unit 300 applies the reading voltage to the column C1, and the row reading unit 420 senses the reading voltage or the reading current through the variable resistor element at the intersection of the row R1 and the column C1.

The row reading unit 420 comprises an AD converter configured to convert the reading voltage or the reading current of the analog level to digital data of m bits (m is an integer greater than or equal to 2). For example, the row reading unit 420 converts the reading voltage or the reading current to 4-bit read data, and decomposes the resistance of the variable resistor element into 16 levels.

According to the selection signal from the control unit 16, the data selecting unit 430 outputs the read data input from the row reading unit 420 to the row writing unit 410 or the data selecting unit 340 of the column selection/signal processing unit 210.

FIG. 6B illustrates input/output data of the data selecting unit 430. When the 1-bit selection signal is "0", the data selecting unit 430 outputs the read data input from the row reading unit 420 to the row writing unit 410, and thereby the data read from the selected row can be written to another selected row. When the 1-bit selection signal is "1", the data selecting unit 430 outputs the reading data input from the row reading unit 420 to the NOR writing unit 350, and thereby the data read from the selected row can be written to the selected memory cell of the memory cell array 110.

Next, the operation of the semiconductor memory device 100 is described in detail as follows.

[Reading Operation]

When a reading instruction and an address are input from external terminals, the X-decoder 130 selects a word line according to the row address, and the Y-decoder 140 selects a bit line and a source line according to the column address. According to the reading instruction, the control unit 160 applies a positive voltage to the selected word line, a reading voltage to the selected bit line, and a GND to the selected source. The control unit 160 disables the entry gate 170 (turns off all transistors Q0~Q3) only during the period when the memory cell array 110 is under operations, so as to separate the crossbar array 200 and the memory cell array 110.

For example, when the memory cell Ma in FIG. 4 is selected, the positive voltage is applied to the selected word line WL1, the reading voltage is applied to the selected bit line BL0, and the GND is applied to the selected source line SL1. The memory cell Ma is turned on or off depending on the data stored therein, and a sense amplifier of the control unit 160 senses the voltage or current of the bit line BL0.

[Writing Operation]

When a writing instruction and an address are input from external terminals, the X-decoder 130 selects a word line according to the row address, and the Y-decoder 140 selects a bit line and a source line according to the column address. Unselected bit lines are in a floating state. According to the writing instruction, the control unit 160 applies a writing voltage to the selected word line, a reading voltage to the selected bit line, and a GND to the selected source.

For example, when writing data "0" to the memory cell Ma, a writing voltage is applied to the selected word line WL1, a writing voltage corresponding to the data "0" is applied to the selected bit line BL0, and the GND is applied to the selected source line SL1.

[Erasing Operation]

When an erasing instruction and an address are input from external terminals, the X-decoder 130 selects a word line according to the row address, and the Y-decoder 140 selects a bit line and a source line according to the column address. According to the erasing instruction, the control unit 160 applies a GND to the selected word line, makes the selected bit line in the floating state, and applies an erasing voltage to the selected source. A high voltage is applied between a gate and a source of the selected memory cell such that the electrons in the selected memory cell escape to the source side, and data in the selected memory cell becomes "1". In addition, plural memory cells in a sector can be erased in a lump.

Next, the writing or reading operation to the crossbar array 200 is described in detail as follows.

[Writing Operation to the Crossbar Array]

According to an instruction and address input from external terminals, the control unit 160 performs a writing operation that writes the data read from the selected memory cell of the memory cell array 110 to the crossbar array 200. Writing to the crossbar array can be a combination of plural instructions and plural addresses. For example, after inputting the instruction and address for reading the memory cell array, the instruction and address for writing the crossbar array 200 can be input.

Figures 7A, 7B:
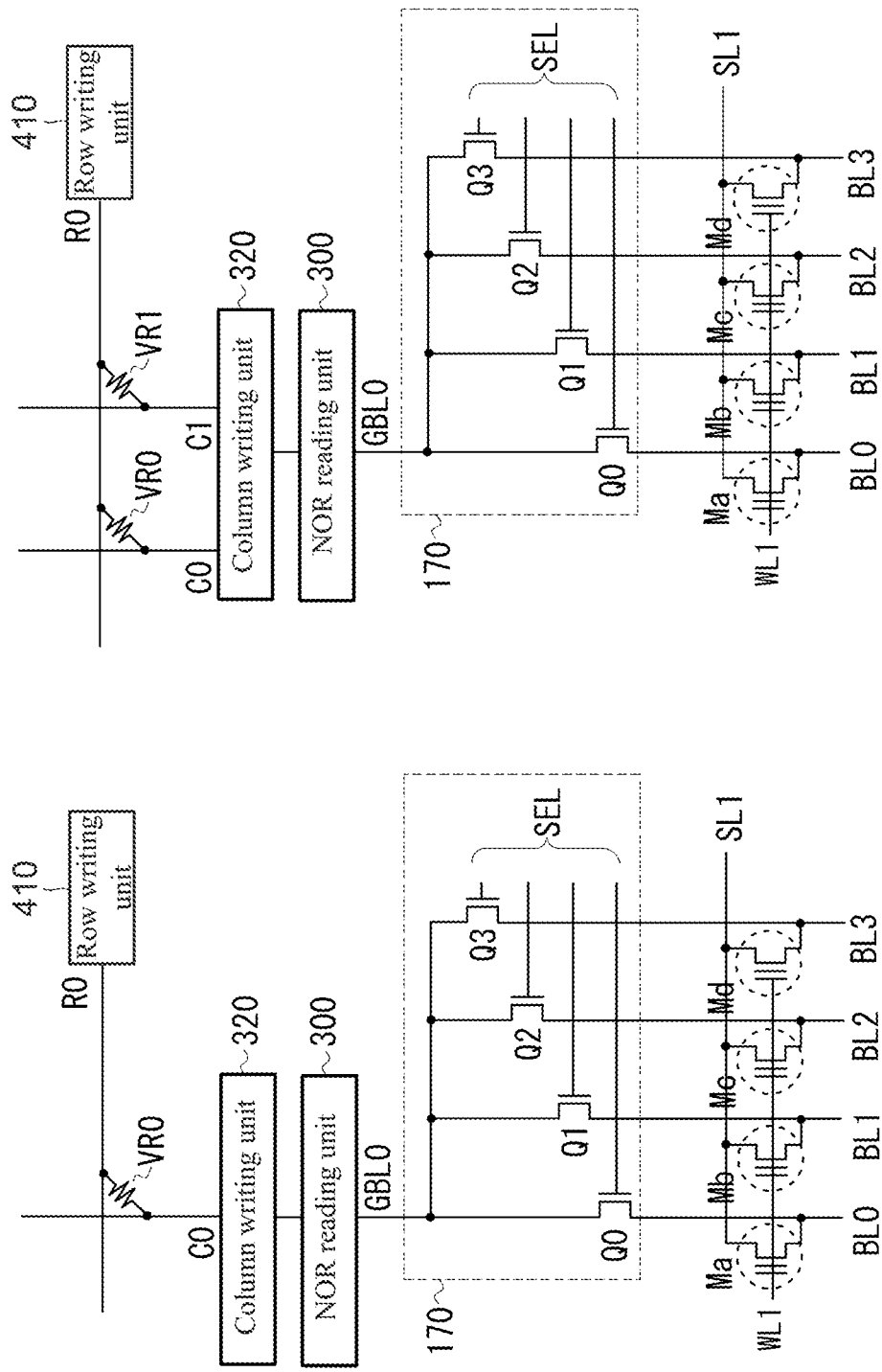
FIG. 7A and FIG. 7B show an example of performing column writing to the crossbar array in accordance with an embodiment of the invention.

For example, as shown in FIG. 7A, the operation to write data to a variable resistor element VR0 at an intersection of a column C0 and a row R0 in the crossbar array 200, is described, wherein the data are read from four memory cells Ma, Mb, Mc and Md which are connected to the selected word line WL1. When writing the data read from the memory cells to the crossbar array 200, the control unit 160 disables the sense amplifier at one side of the memory cell array, and enables the NOR reading unit 300 of the column selection/signal processing unit 210.

When selecting the memory cell Ma according to the reading instruction and address from outside, the entry gate 170 turns on the transistor Q0 based on the selection signals SEL (other transistors is turn-off), and connects the bit line BL0 to the NOR reading unit 300 via a global bit line GBL0, and the NOR reading unit 300 reads the data of the memory cell Ma.

Next, the column writing unit 320 receives the read data held in the NOR reading unit 330 according to a writing instruction to write the crossbar array and an address from outside. The column selecting unit 310 selects the column C0 based on the input column address, and the row selecting unit 400 selects the row R0 based on the input row address, the column writing unit 320 applies to the column C0 a writing pulse corresponding to the read data, and the row writing unit 410 applies GND to the row R0. For example, if the read data is "0", a writing pule is applied to the column C0, and if the read data is "1", the writing pule is not applied to the column C0.

Next, when selecting the memory cell Mb according to the reading instruction and address from outside, the entry gate 170 turns on the transistor Q1 based on the selection signals SEL, and connects the bit line BL1 to the NOR reading unit 300 via the global bit line GBL0, and the NOR reading unit 300 reads the data of the memory cell Mb. Then, according to the reading instruction and address from outside for the crossbar array, similar to the above descriptions, the column writing unit 320 applies the writing pulse to the column C0 based on the data read by the NOR reading unit 300. Afterwards, similarly the data of the memory cells Mc and Md are read, and the column writing unit 320 applies to column C0 the writing pulse corresponding to the data to be written. If all 4-bit data of the memory cells MA, Mb, Mc and Md are "0", four writing pulses are applied to the variable resistor elements VR0 at the intersection of the row R0 and column C0, and an addition result of the 4-bit data of the memory cells MA, Mb, Mc and Md is written to the variable resistor element VR0.

In the way described above, the instruction and address are input every time when reading the memory cells Ma, Mb, Mc and Md, but it is not limited thereto, and plural memory cells on the same word line may be read in burst by one instruction. In addition, writing crossbar array may be performed by one instruction, and at this moment the NOR reading unit 300 keep reading in burst the 4-bit data, and the column writing unit 320 applies the writing pulse according to the 4-bit data held in the NOR reading unit 300. Furthermore, the column writing unit 320 may convert the 4-bit data to a writing pulse having a peak value of the analog level and applies one time writing pulse to the variable resistor element.

Moreover, although an example of writing read data to the variable resistor element VR0 has been shown, but this is only one example not intended to limit, and the read data from any number of memory cells at any address can be written to any number of variable resistor elements at any address according to the input address.

For example, eight memory cells on the same word line may be selected, and the addition result of the 8-bit data of the selected memory cells may be written into one variable resistor element. In addition, as shown in FIG. 7B, a plurality of columns C0 and C1 may be selected by the column selection section 310, and the 4-bit data of the memory cells Ma, Mb, Mc, and Md may be simultaneously written to the variable resistor elements VR0 and VR1.

Figures 8A, 8B:
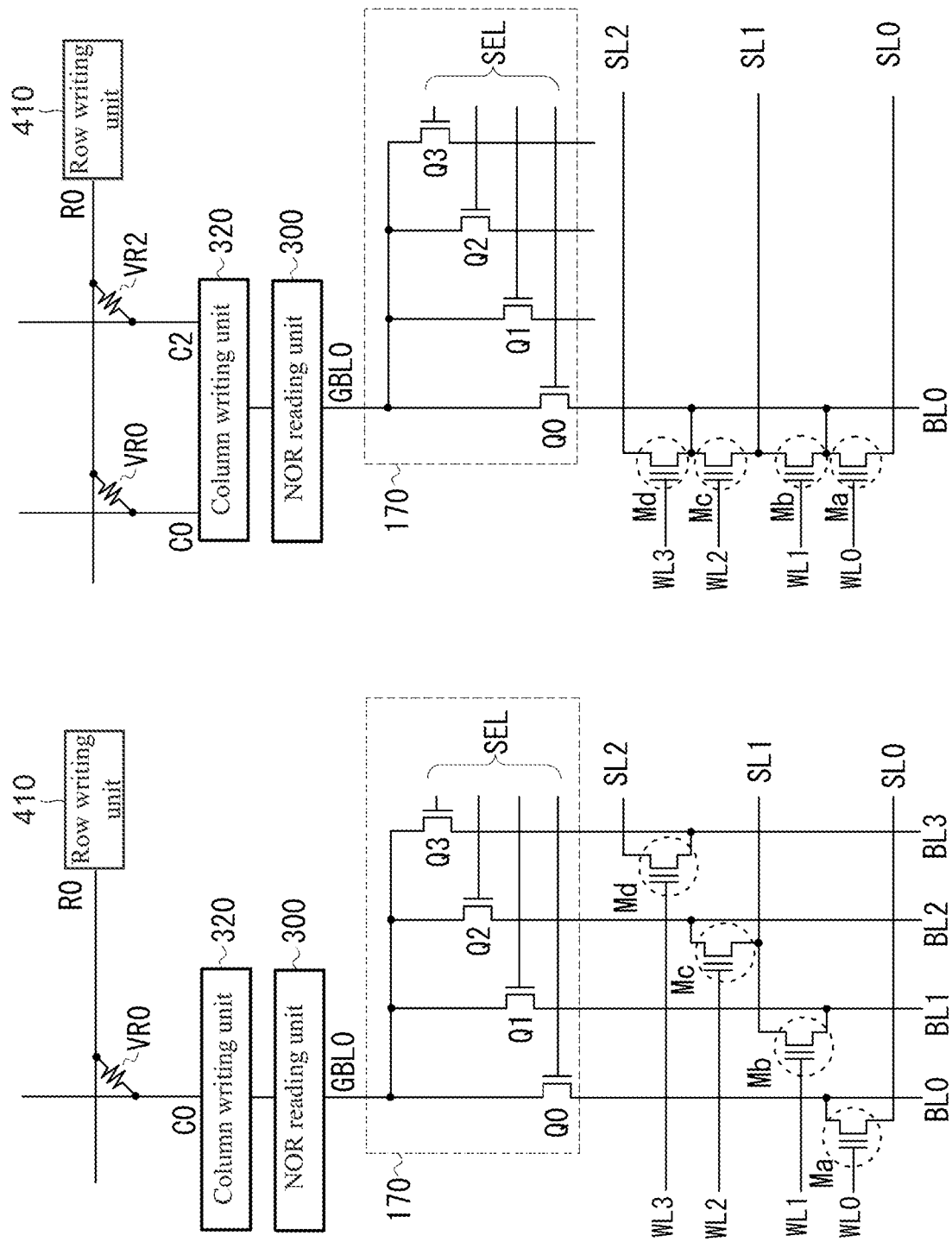
FIG. 8A and FIG. 8B show an example of performing column writing to the crossbar array in accordance with an embodiment of the invention.

Moreover, as shown in FIG. 8A, the memory cells Ma, Mb, Mc, and Md on different word lines WL0, WL1, WL2, and WL3 may be selected, and the addition result of these 4-bit data is written to the variable resistor element VR0. Furthermore, as shown in FIG. 8B, the memory cells Ma, Mb, Mc, and Md on the same bit line BL0 but on different word lines WL0, WL1, WL2, and WL3 may be selected, and the addition result of the 4-bit data is written to the variable resistor element VR0.

In addition, as shown in FIG. 5A and FIG. 5B, the column writing unit 320 may select the read data from the column read unit 330 or the read data from the row reading unit 420 which is output from the data selecting unit 340, and write to the selected column.

[Writing Operation to the NOR Array]

According to the instruction and address input from outside, the control unit 160 performs a writing operation to write the read data from the crossbar array 200 to the selected cell of the memory cell array 110. Writing to the memory cell array 110 can be a combination of plural instructions and plural addresses, for example, after inputting the instruction and address for reading the crossbar array 200, the instruction and address for writing the memory cell array 110 can be input.

Figure 9B:
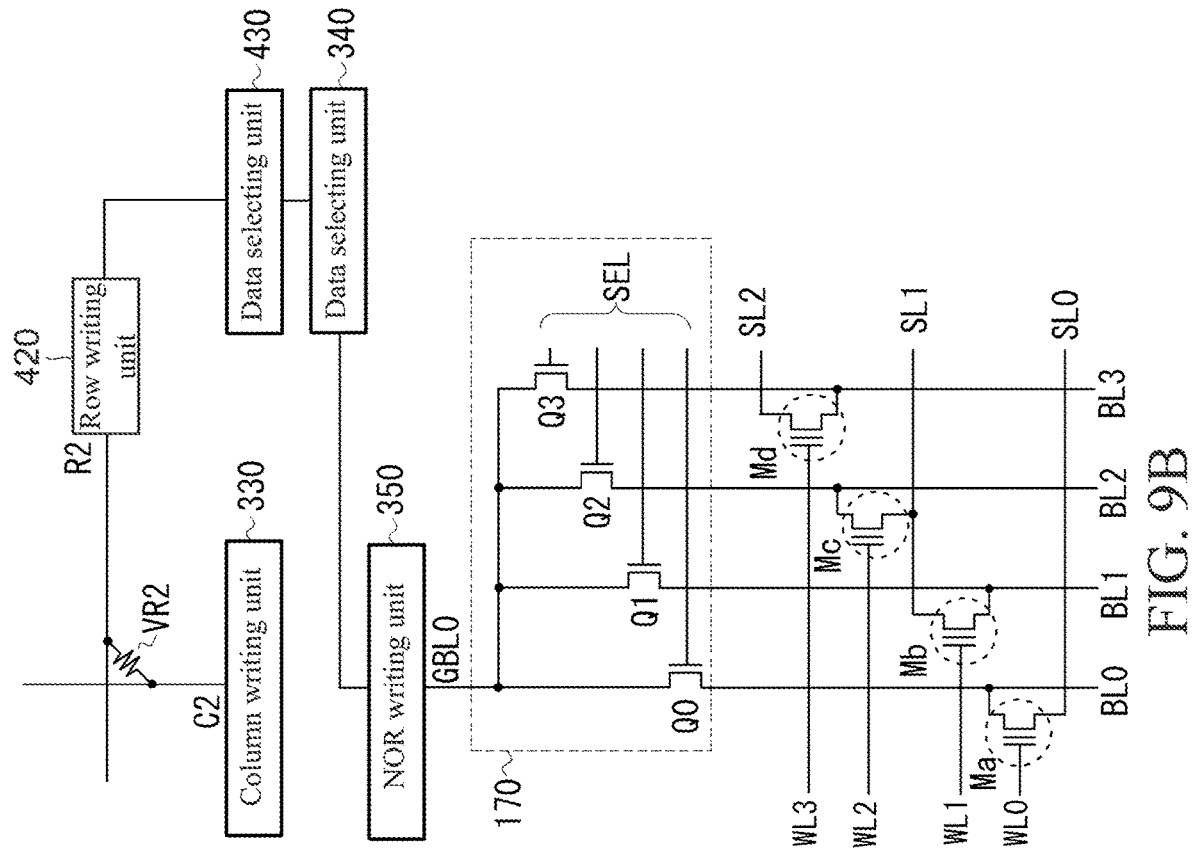
FIG. 9A and FIG. 9B show an example of performing writing to the memory cell array in accordance with an embodiment of the invention.
Figure 9A:
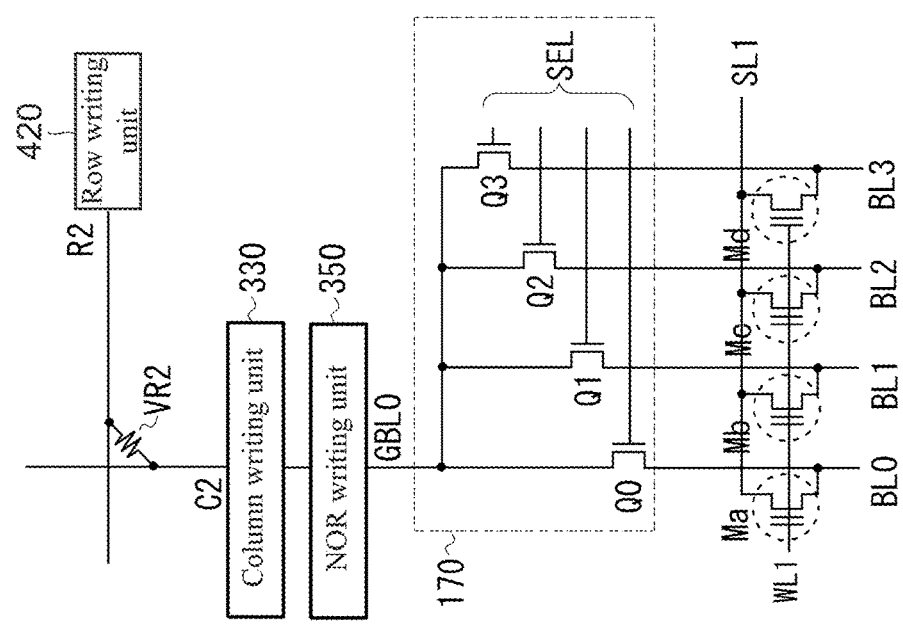

For example, as shown in FIG. 9A, the operation to writing data to four memory cells Ma, Mb, Mc and Md which are connected to the selected word line WL1, is described, wherein the data are read from a variable resistor element VR2 connecting an intersection of a column C2 and a row R2 in the crossbar array 200. Further, assume that analog data of the variable resistor element VR2 can be converted to 4-bit data. In addition, assume that the memory cells Ma, Mb, Mc and Md are in an erasing state (having data "1").

When writing the data read from the crossbar array 200 to the memory cell array 110, the control unit 160 disables the sense amplifier at one side of the memory cell array and enables the NOR writing unit 350 of the column selection/signal processing unit 210.

When selecting the variable resistor element VR2 according to the reading instruction and address from outside, the row reading unit 420 applies a reading pulse to the row R2 selected by the row selecting unit 400, and the column reading unit 330 receives a reading voltage or a reading current of the column C2 selected by the column selecting unit 310, converting it to 4-bit data and hold the 4-bit data.

Next, according to a writing instruction and address from the outside, the entry gate 170 turns on the transistor Q0 (other transistors are turn-off) based on the selection signal SEL, and selects the bit line BL0 via the global bit line GBL0. A writing voltage is applied to the selected word line WL1, a GND is applied to the selected source line SL1, and the NOR writing unit 350 writes 1-bit read data of the 4-bit data held in the column read unit 330 to the memory cell Ma via the bit line BL0.

Next, according to the writing instruction and address from the outside, the entry gate 170 turns on the transistor Q1 (other transistors are turn-off) based on the selection signal SEL, and selects the bit line BL1 via the global bit line GBL. A writing voltage is applied to the selected word line WL1, the GND is applied to the selected source line SL1, and the NOR writing unit 350 writes the 1-bit read data of the 4-bit data held in the column reading unit 330 to the memory cell Mb via the bit line BL1. Writing to the memory cells Mc and Md is performed in the same way as described above. In this way, the memory cells Ma, Mb, Mc, and Md store the learned data of the variable resistor element VR2.

Moreover, as shown in FIG. 9B, the NOR writing unit 350 can write the data read by the row reading unit 420 to the memory cells Ma, Mb, Mc, and Md of the memory cell array 110. In this example, the memory cells Ma, Mb, Mc, and Md are connected to different word lines WL0, WL1, WL2, and WL3.

In addition, in the above example, 4-bit read data is written in the memory cells Ma, Mb, Mc, and Md, but this is just an example, and the number of the memory cells to be selected can be determined according to the resolution (the number of bits) of an AD converter for converting analog data stored in the variable resistor element into digital data. For example, if 8-bit data are generated by the AD converter, the 8-bit data are written to each of the 8 memory cells. Also, if the memory cells can store multilevel data, the corresponding number of memory cells is selected accordingly. Furthermore, it is possible to read data from the variable resistor elements at arbitrary positions in the crossbar array 200 according to an input address, and to write the read data to the memory cells at arbitrary positions according to an input address.

Figure 10:
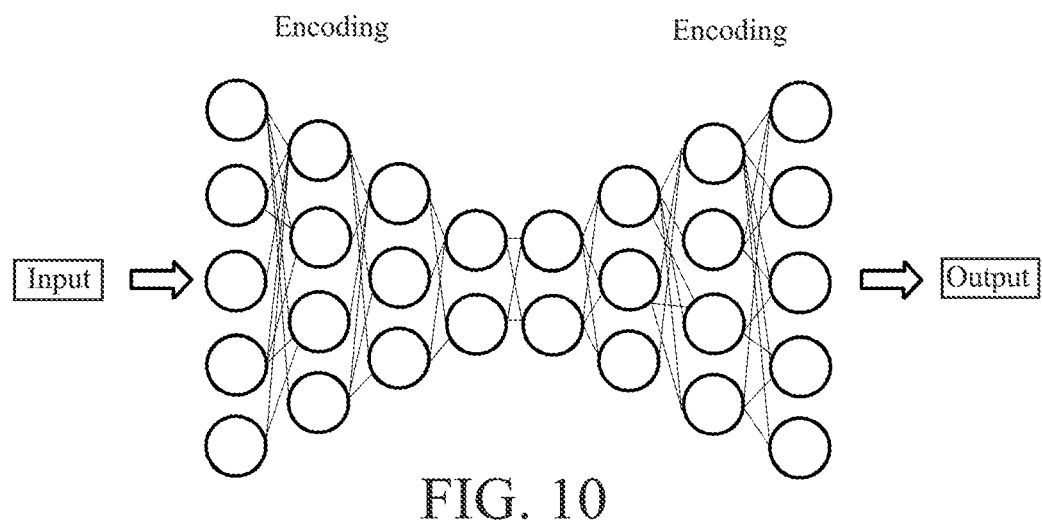
FIG. 10 is an illustrated diagram showing an example of an automatic encoder using neural network.

FIG. 10 shows an example of an auto-encoder using a neural network. The auto-encoder includes multiple layers of encoder and multiple layers of decoder between the input and the output, where the weightings or signs of the encoder and the decoder are adjusted by learning. The crossbar array 200 processes each layer of the encoder and the decoder between the input and output. In other words, the read data from the memory cell 110 is processed in the i-th layer, the output signal is input to the next i+1-th layer, and the output signal processed in the i+1-th layer is sent to the next i+2-th layer, and the process is sequentially repeated.

By writing (copying back) the learned data in the crossbar array 200 to the memory cell array 110, The memory cell array 110 holds the learned data, and an external controller can use the learned data to perform various processes (e.g., image processing, prediction processing, natural language processing, etc.).

In this way, according to this embodiment, a semiconductor memory device can be used as a neuromorphic chip having an AI learning function, by configuring the semiconductor memory device to have a flash memory cell array and a crossbar array. Moreover, on the crossbar array by operating the learning data stored in the flash memory cell array, it is possible to improve the efficiency and the speed of arithmetic processing. In addition, by arranging the column selection/signal processing unit on the column side and the row selection/signal processing unit on the row side of the crossbar array, the loss resulting from signal transmission can be suppressed and the matrix operation can be efficiently performed by the crossbar array.

Next, a second embodiment according to the present invention will be described in detail as follows. In the first embodiment an example shows that writing pulses are applied according to the read data "0" and "1". In the second embodiment, the column writer and the row writer write spike signals suitable for the STDP of the neural network.

Figure 11:
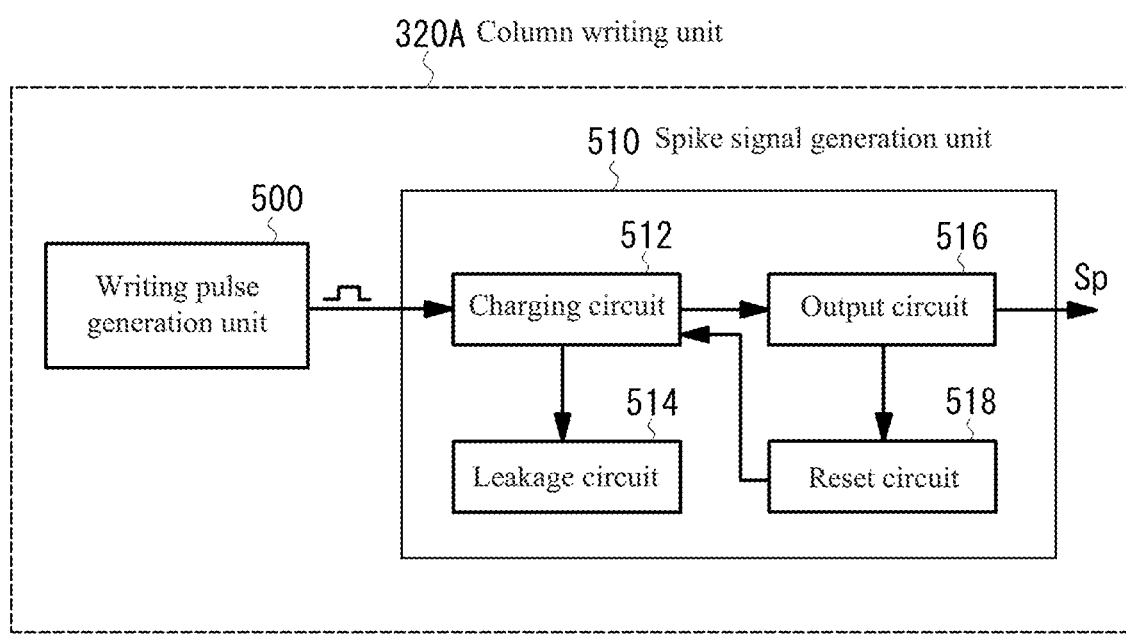
FIG. 11 is a block diagram showing the structure of the column writing unit in accordance with a second embodiment of the present invention.

FIG. 11 illustrates the structure and configuration of a column writing unit according to the second embodiment. The row writing unit is configured in the same manner as the column writing unit, so a description thereof will be omitted here. The column writing unit 320A comprises a writing pulse generation unit 500 configured to generate a writing pulse based on the read data, and a spike signal generation unit 510 configured to generating a spike signal based on the writing pulse.

The writing pulse generation unit 500 generates a writing pulse having a constant pulse width and outputs it to the spike signal generation unit 510, for example, when the read data from the NOR reading unit 300. The writing pulse generation unit 500 does not output the writing pulse when the read data is "1".

The spike signal generation unit 510 simulates synapse signals generated by neurons. The spike signal generation unit 510 comprises a charging circuit 512 configured to charge the electric charge to a capacitor in response to the writing pulse from the writing pulse generation unit 500, a leakage circuit 514 configured to leak or discharge the electric charge which is charged to the capacitor over time, an output circuit 516 configured to output a spike signal Sp when the electric charge of the capacitor reaches a threshold value, and a reset circuit 518 configured to reset the electric charge of the capacitor when the spike signal is output.

When the writing pulse is applied, the charging circuit 512 charges the capacitor during the pulse width period of the writing pulse. The leakage circuit 514 includes, for example, a resistor connected in parallel with the capacitor, and discharges the charge charged in the capacitor through the resistor. The discharging speed of the electric charge can be changed by adjusting the resistance of the resistor. The charging circuit 512 accumulates the electric charge charged to the capacitor by applying the writing pulse, and on the other hand, the leakage circuit 514 discharges the electric charge charged to the capacitor. The longer the time until the next writing pulse is applied, the greater the leakage of the charge charged in the capacitor. The function of the leakage circuit 514 corresponds to oblivion or the like in the human brain, and enables the generation of the STDP spike signal Sp.

The output circuit 516 compares the capacitor voltage generated according to the electric charge in the capacitor and a threshold value, and outputs the spike signal Sp when the capacitor voltage exceeds the threshold value. The spike signal Sp is applied to the column selected by the column selecting unit 310.

Figure 12A:
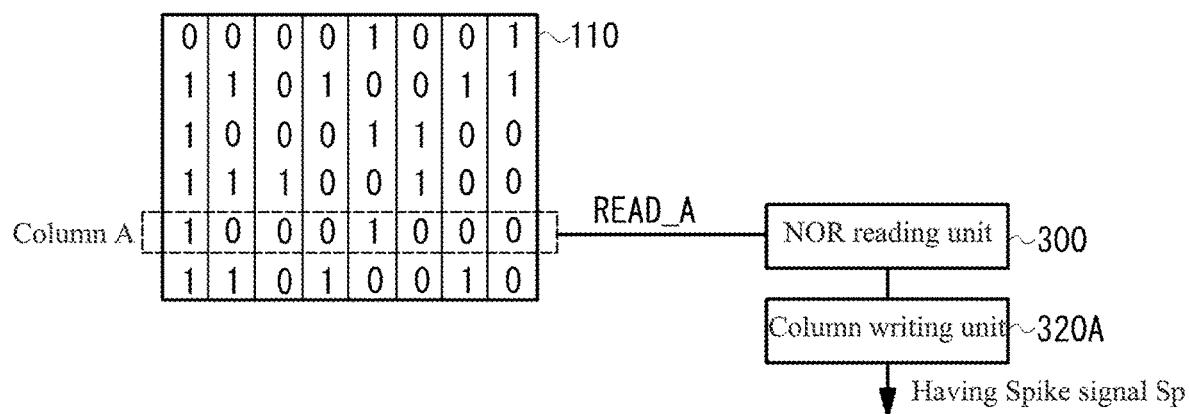
FIG. 12A and FIG. 12B are illustrated diagrams showing a writing instance in accordance with the second embodiment of the present invention.
Figure 12B:
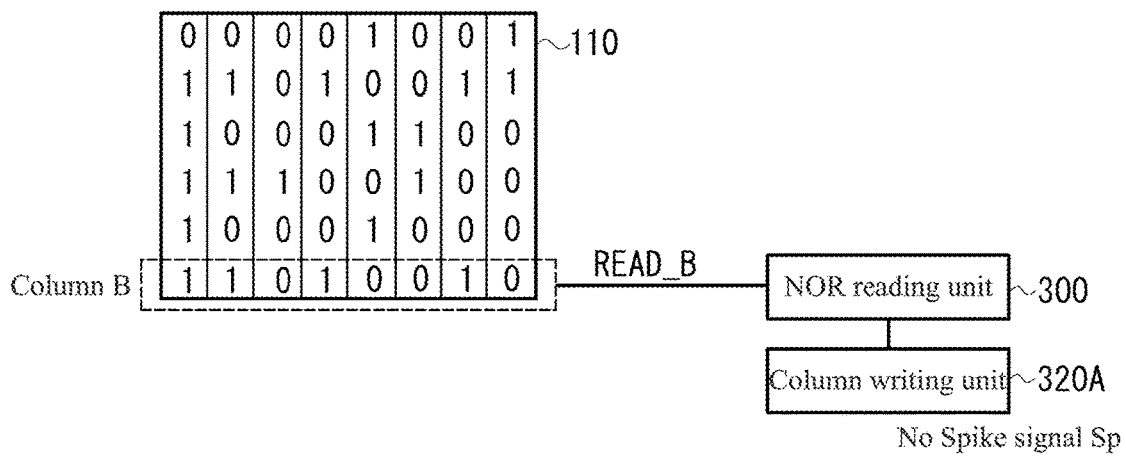

FIGS. 12A and 12B illustrate a writing example of the column writing unit 320A. Here, assume that 8-bit data of a column A and a row B of the memory cell array 110 are read, and the read data are written to the selected row of the crossbar array. As shown in FIG. 12A, the NOR reading unit 300 reads 8-bit data of column A and provides the read data to the column writing unit 320A. The writing pulse generation unit 500 generates a writing pulse in response to 6-bit data of "0" in the 8-bit read data. In other words, six writing pulses are output sequentially to the spike signal generation unit 510. The charging circuit 512 charges the electric charge to the capacitor in response to the 6 writing pulses. When the capacitor voltage reaches the threshold value at the sixth writing pulse, the output circuit 516 outputs the spike signal Sp, and at the same time he reset circuit 518 discharges the electric charge of the capacitor to GND.

On the other hand, when the NOR reading unit 300 reads 8-bit data of column B as shown in FIG. 12B, the writing pulse generation unit 500 generates a writing pulse in response to 4-bit data of "0" in the 8-bit read data. The charging circuit 512 charges the electric charge to the capacitor in response to 4 writing pulses, however, the spike signal Sp is not output from the output circuit 516 because the capacitor voltage does not reach the threshold value. Since the spike signal Sp is not output, resetting by the reset circuit 518 is not performed, the electric charge is held in the capacitor but the leakage circuit 514 leaks the electric charge over time. If the leaked electric charge is large, even if the two writing pulses are applied after the leakage, the capacitor voltage cannot reach the threshold value and the spike signal Sp will not be output.

In this way, according to this embodiment, since the STDP spike signal is generated, it is possible to provide a neuromorphic device that optimizes the synapse bond strength.

In the above embodiment, a configuration is shown in which the column selection/signal processing unit 210 that performs column-side processing on the crossbar array 200 and the row selection/signal processing unit 220 that performs row-side processing are provided, however, the invention is not limited the configuration, and may be configured to omit the reading or writing from the row-side of the crossbar array 200 and to merely perform the reading or writing from the column-side of the crossbar array 200. At this moment, the column selection/signal processing unit 210 writes the data read from the memory cell array 110 to the crossbar array 200 from the column side, and writes the data read from the column side of the crossbar array 200 to the memory cell array 110. The row side of the crossbar array 200 selects a row based on the row address. For example, the column selection/signal processing unit 210 repeatedly writes a plurality of data read from the memory cell array 110 to the selected variable resistor elements of the crossbar array 200, so as to change the resistances (i.e., make the elements learn) of the selected variable resistor elements, and then the learned data of the variable resistor elements are read, and the read data are written to the memory cell array 110.

Furthermore, in the above embodiment, an example shows that the crossbar array is mounted on the NOR type flash memory, but instead of the NOR type flash memory, the crossbar array may be mounted on the NAND type flash memory.

Although preferred embodiments of the present invention have been described in detail, the present invention is not limited to specific embodiments, and various modifications and variations can be made within the spirit and scope of the invention described in the claims.

What is claimed is:
1. A semiconductor memory device, comprising:
a memory cell array, having a plurality of non-volatile memory cells arranged in a matrix;
a crossbar array, having a plurality of rows and columns, and variable resistor elements formed in intersections of the rows and the columns;
a connection device, arranged between the memory cell array and the cross-bar array, and connecting a selected bit line of the memory cell array to the crossbar array according to a selection signal;

a column writing device, writing data read from the memory cell array to a selected column of the crossbar array;

a column reading device, reading data of a selected column of the crossbar array;

a writing device, writing the data read by the column reading device to the memory cell array;

a row reading device, reading data of a selected row of the crossbar array; and a row writing device, at least writing the data read by the row reading device to the selected row of the crossbar array.

2. The semiconductor memory device as claimed in claim 1, further comprising:

a column-side selecting device, providing the data read by the column reading device or the data read by the row reading device to the column writing device or the writing device.

3. The semiconductor memory device as claimed in claim 2, further comprising:

a row-side selecting device, providing the data read by the row reading device to the row writing device or the column-side selecting device.

4. The semiconductor memory device as claimed in claim 1, further comprising:

a column selecting device, selecting a column of the crossbar array based on address information; and a row selecting device, selecting a row of the crossbar array based on the address information;

wherein the column writing device writes to the column selected by the column selecting device, the column reading device reads the column selected by the column selecting device;

wherein the row writing device performs writing to the row selected by the row selecting device, and the row reading device performs reading to the row selected by the row selecting device.

5. The semiconductor memory device as claimed in claim 4, wherein the column selecting device selects a plurality of columns, and the column writing device performs writing to the plurality of selected columns simultaneously.

6. The semiconductor memory device as claimed in claim 4, wherein the row selecting device selects a plurality of rows, and the row writing device performs writing to the plurality of selected rows simultaneously.

7. The semiconductor memory device as claimed in claim 1, wherein the column writing device applies writing pulses to a selected column based on read data.

8. The semiconductor memory device as claimed in claim 1, wherein the row writing device applies writing pulses to the selected row based on read data.

9. The semiconductor memory device as claimed in claim 1, wherein the writing device comprises an AD (analog-to-digital) conversion device which converts analog data read from the crossbar array to m-bit digital data;

wherein the writing device writes the m-bit digital data to m memory cells selected from the memory cell array.

10. The semiconductor memory device as claimed in claim 1, wherein the writing device comprises a DA (digital-to-analog) conversion device which converts m-bit digital data read from the memory cell array to analog data;

wherein the writing device writes the analog data to a selected column of the crossbar array.

11. The semiconductor memory device as claimed in claim 1, wherein the column writing device, the column reading device, the writing device, the column-side selecting device and the column selecting device are arranged at a column side of the crossbar array;

wherein the row writing device, the row reading device, the row-side selecting device and the row selecting device are arranged on a row side of the crossbar array;

wherein the crossbar array is stacked on the memory cell array, or the memory cell array is stacked on the crossbar array.

12. The semiconductor memory device as claimed in claim 1, wherein the memory cell array is a NOR-type memory cell array or NAND-type memory cell array.

13. The semiconductor memory device as claimed in claim 1, wherein the memory cell array stores AI learning data;

wherein the crossbar array performs matrix operations to the AI learning data read from the memory cell array, and writes the matrix-operated data to the memory cell array.

* * * * *